United States Patent
Chau et al.

(10) Patent No.: US 6,620,252 B2
(45) Date of Patent: Sep. 16, 2003

(54) METALLIZATION MODULE FOR CATHODE-RAY TUBE (CRT) APPLICATIONS

(75) Inventors: Ton Ich Chau, Reading, PA (US); Sheldon Lynn Horst, Columbia, PA (US)

(73) Assignee: Thomson Licensing S.A., Boulogne Cedex (FR)

( * ) Notice: Subject to any disclaimer, the term of this patent is extended or adjusted under 35 U.S.C. 154(b) by 113 days.

(21) Appl. No.: 10/057,567

(22) Filed: Oct. 29, 2001

(65) Prior Publication Data

US 2003/0079690 A1 May 1, 2003

(51) Int. Cl.[7] ............................................. C23C 14/00
(52) U.S. Cl. ....................... 118/726; 118/728; 118/733; 118/50; 118/500; 118/503; 427/69
(58) Field of Search ................................ 118/500, 503, 118/726, 728, 733, 50; 427/69, 70

(56) References Cited

U.S. PATENT DOCUMENTS

| | | | | |
|---|---|---|---|---|
| 903,377 A | * | 11/1908 | Saulnier | 294/144 |
| 2,916,394 A | * | 12/1959 | Rychlewski | 427/68 |
| 3,015,586 A | * | 1/1962 | Toohig | 427/107 |
| 3,915,117 A | * | 10/1975 | Schertler | 118/719 |
| 4,528,210 A | * | 7/1985 | Noji et al. | 427/70 |
| 4,648,346 A | * | 3/1987 | Miyazawa et al. | 118/500 |
| 4,842,894 A | * | 6/1989 | Ligtenberg et al. | 427/65 |
| 5,807,435 A | * | 9/1998 | Poliniak et al. | 118/504 |
| 6,068,738 A | * | 5/2000 | Bjornard et al. | 204/192.12 |
| 6,228,421 B1 | * | 5/2001 | Ito | 427/66 |
| 6,428,840 B2 | * | 8/2002 | Adachi | 427/69 |

* cited by examiner

*Primary Examiner*—Richard Bueker
(74) *Attorney, Agent, or Firm*—Joseph S. Tripoli; Joseph J. Laks; Carlos M. Herrera

(57) ABSTRACT

A metallization module for applying a metal layer on the screen of a CRT faceplate panel is described. The metallization module comprises a vacuum chamber having sidewalls, a base, an adaptor plate, and a lid. The adaptor plate is positioned between the lid and the sidewalls of the metallization module. Evacuation of the vacuum chamber causes atmospheric pressure to act against the outside surface of the lid, forming an airtight seal between the lid, the adaptor plate, and the top lip of the sidewalls. A plurality adjustable rods in conjunction with the adaptor plate are used to support the faceplate panel within the metallization module.

7 Claims, 4 Drawing Sheets

METALLIZATION MODULE FOR CATHODE-RAY TUBE (CRT) APPLICATIONS

FIELD OF THE INVENTION

The invention relates to the manufacture of a color cathode-ray tube (CRT) and, more particularly to an apparatus for depositing a metal layer on a faceplate panel of the color cathode-ray tube (CRT).

BACKGROUND OF THE INVENTION

In the method of applying a metal layer on the screen of a CRT faceplate panel, a coat of aluminum is applied to the lateral interior surface of the panel by vaporization of aluminum pellet when heated. This method has become known in the art as aluminizing the screen. Its primary purpose is to impart to the back surface of the screen the property of specular reflection to the end that maximum brightness may be attained by directing all of the light generated in the screen to the faceplate of the tube.

A mechanical assembly used in this process involves placing the panel over an open end of a vacuum chamber. The vacuum chamber is shaped and dimensioned in accordance with a particular model of faceplate panel. A comparably sized support frame is arranged around the open end of the vacuum chamber to receive and support the panel. A resilient, non-porous gasket is arranged on the support frame to receive a seal edge of the panel. When the chamber is evacuated, atmospheric pressure pushed pushes the seal edge of the panel onto the seal surface of the gasket to form an airtight seal between the gasket and the edge of the panel. Many different size assemblies are needed to accommodate all the different size faceplate panels that are to be manufactured. Accordingly, a new metallization module is provided for applying a reflective aluminum layer to the screen of a cathode-ray tube.

SUMMARY OF THE INVENTION

The present invention relates to a metallization module for applying a metal layer on the screen of a CRT faceplate panel. The metallization module comprises a vacuum chamber having sidewalls, a base, an adaptor plate, and a lid. The adaptor plate is positioned between the lid and the sidewalls of the metallization module. Evacuation of the vacuum chamber causes atmospheric pressure to act against the outside surface of the lid, forming an airtight seal between the lid, the adaptor plate, and the top lip of the sidewalls. One or more adjustable rods on the adaptor plate are used to support the faceplate panel within the metallization module.

BRIEF DESCRIPTION OF THE DRAWINGS

The invention will now be described in greater detail, with relation to the accompanying drawings, in which.

DETAILED DESCRIPTION OF THE PREFERRED EMBODIMENT

Figure 1:
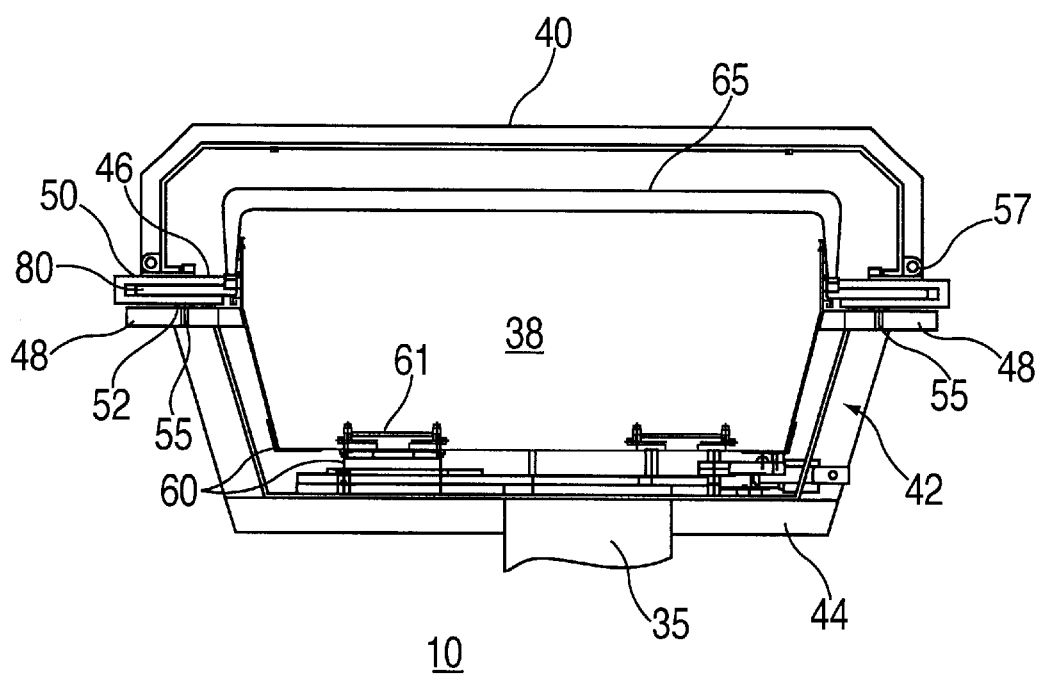
FIG. 1 is a section of a metallization module of the present invention.

FIG. 1 depicts a cross-sectional view of a metallization module 10 for applying a metal layer on the screen of a CRT faceplate panel. The metallization module 10 comprises a vacuum chamber 38 having formed by sidewalls 42 extending from a base 44. The sidewalls 42 include an adaptor plate 46 upon which a lid 40 is secured. The lid 40 extends around the perimeter of the sidewalls 42 over adaptor plate 46 to thereby seal the metallization module 10. The sidewalls 42, base 44, adaptor plate 46, and lid 40 are preferably made of stainless steel. For example, 304 stainless steel and/or 316 stainless steel may be used for any of the sidewalls 42, base 44, adaptor plate 46, and lid 40. The stainless steel used for the sidewalls 42, base 44 and lid 40 should have a minimum thickness of about 0.635 cm. The stainless steel used for the adaptor plate 46 should preferably have a minimum thickness of about 2.54 cm.

The sidewalls 42 and base 44 form a cavity 39 having an open end within which are provided tooling and shielding 60 for evaporating a metal layer on the inner surface of a CRT faceplate panel 65. The base 44 also includes a port 35, which is coupled to a vacuum system (not shown). The vacuum system is used to evacuate the metallization module 10 when the metal layer is formed on the faceplate panel The adaptor plate 46 is positioned between the lid 40 and the sidewalls 42 of the metallization module 10. The adaptor plate 46 is attached along the top lip 48 of the sidewalls 42. The adaptor plate 46 may be attached to the top lip 48 with one or more screws 55. Alternatively, the adaptor plate 46 may be welded to the top lip 48 (not shown).

At least one side of the lid 40 may be attached to the adaptor plate 46. The lid 40 may be attached to the adaptor plate 46 with one or more hinges 57 and releasably securable to the adaptor plate 46 over the top lip 48 of the sidewalls 42.

The adaptor plate 46 may optionally have a sealing gasket 50 and a bottom gasket 52 positioned along the top and bottom surfaces thereof. The sealing gasket 50 and bottom gasket 52 may be made of a resilient, non-porous material such as rubber to provide an air-tight seal with the lid 40 around the open end of the vacuum chamber of metallization module 10. Examples of suitable rubber materials include natural rubber and impregnated carbon. The sealing gasket 50 may have a thickness of at least about 0.46 cm, suitable to absorb shear forces imparted from the lid to the sealing gasket 50 when the metallization module 10 is evacuated. The bottom gasket 52 may be an o-ring having a material of at least about 0.305 cm.

Activation of the vacuum system causes air within the vacuum chamber 38 to be evacuated therefrom. The air is evacuated through port 35 causing atmospheric pressure to act against the outside surface of the lid 40, forming an airtight seal between the lid 40, the adaptor plate 46, and the top lip 48 of the sidewalls 42. One airtight seal is formed between the lid 40 and the adaptor plate 46 with sealing gasket 50. Another airtight seal is formed between the adaptor plate 46 and the sidewalls 42 with the bottom gasket 52.

A plurality of adjustable rods 80 in conjunction with the adaptor plate 46 are used to support the faceplate panel 65 within the metallization module 10. The adjustable rods 80 may be positioned along the edges of the adaptor plate 46, as shown in FIGS. 2a–2b.

Figure 2A:
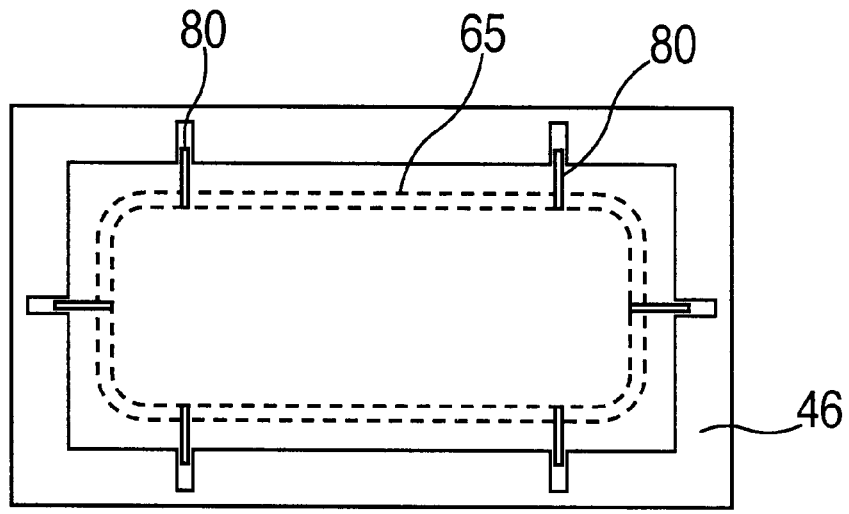
FIGS. 2a–2b depict top views of the adaptor plate showing the positioning of the one or more adjustable rods.
Figure 2B:
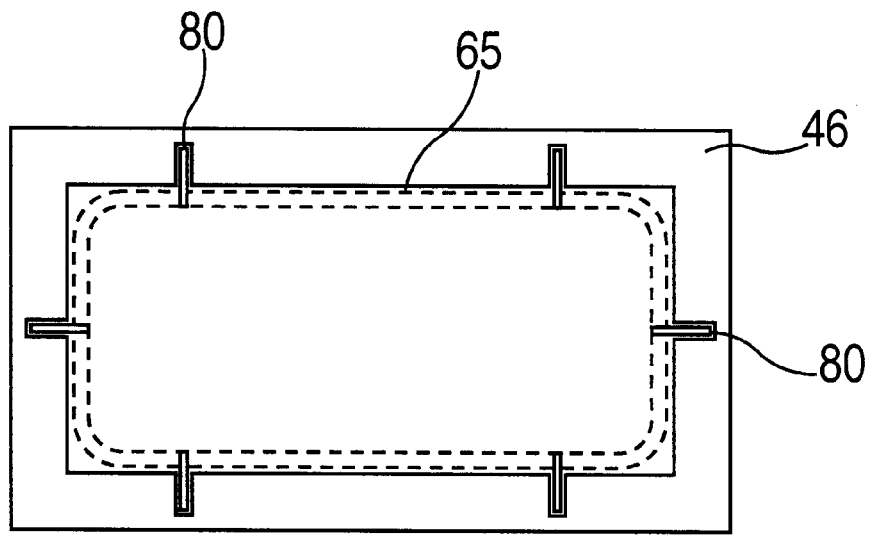

Referring to FIG. 2a, six adjustable rods 80, for example, may be used to support a faceplate panel 65. For smaller faceplate panels, the adjustable rods 80 are extended away from the sides of the adaptor plate 46 to support the faceplate panel 65 within the vacuum chamber 10, as shown in FIG. 2a. For larger faceplate panels, the adjustable rods 80 are retracted into the sides of the adaptor plate 46 to support the faceplate panel 65 within the vacuum chamber 10, as shown in FIG. 2b.

Figure 3A:
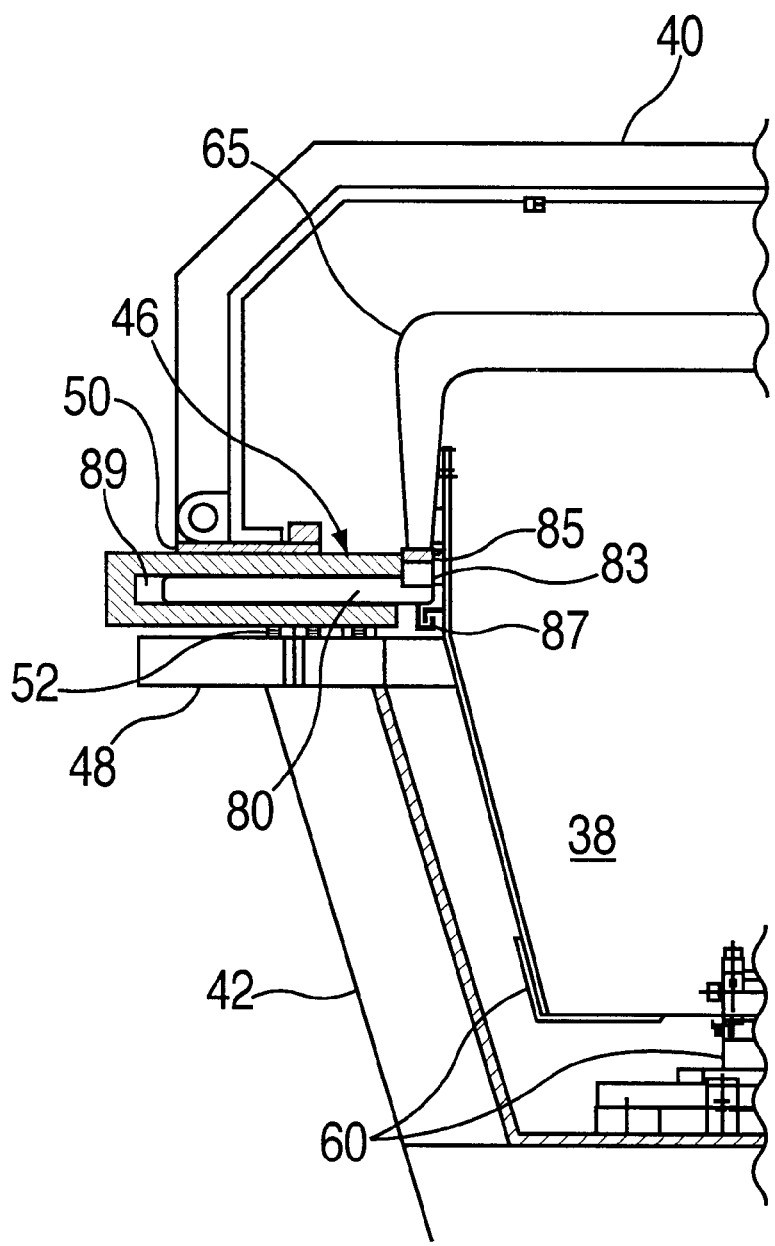
FIGS. 3a–3b depict views of the adjustable rod in an extended position and in a retracted position.
Figure 3B:
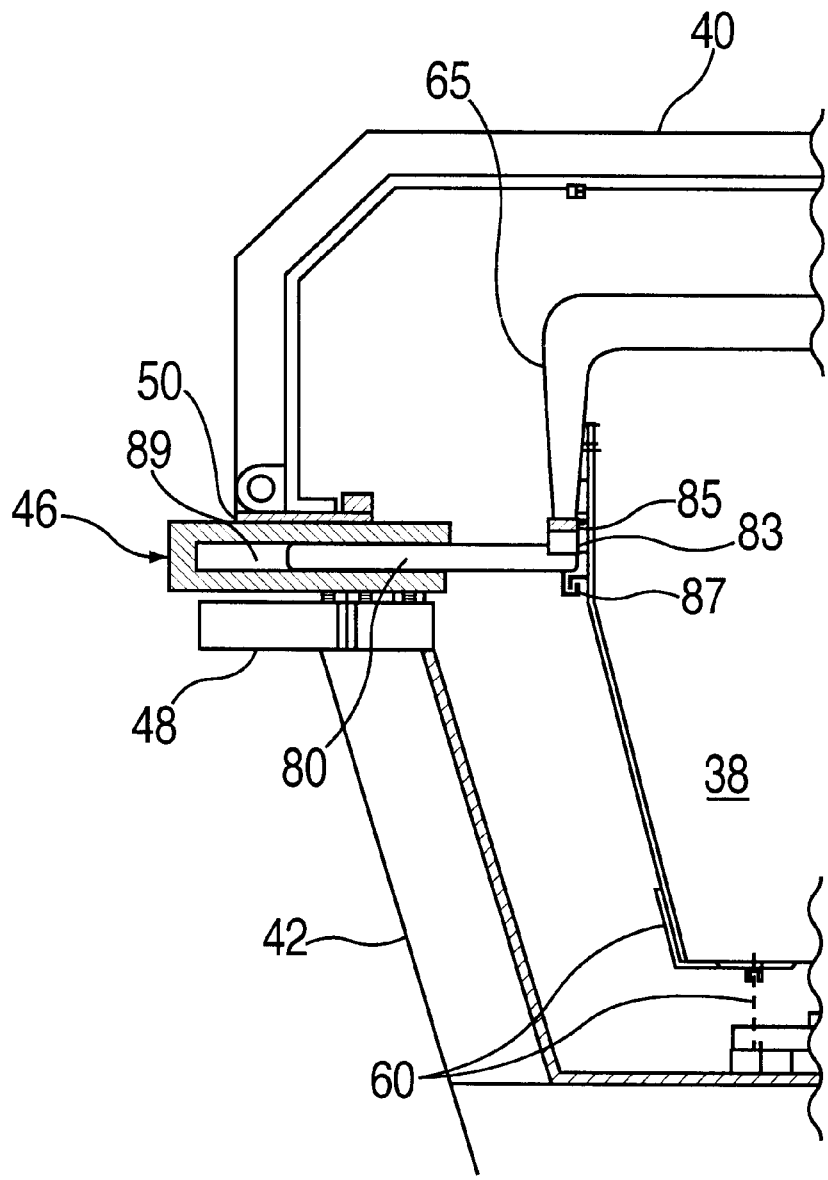

FIGS. 3a–3b further illustrate that each adjustable rod 80 is positioned in a blind hole 89 formed in the adaptor plate 46. The adjustable rod is moveable in a lateral direction relative to the adaptor plate 46, by sliding it within the blind hole 89 therein. Optionally, the adjustable rod and blind hole may be threaded (not shown), such that rotating it about one end moves the rod laterally within the blind hole 89.

Each adjustable rod 80 includes a ledge 83, upon which is positioned a resilient material 85, such as, for example, rubber. The resilient material 85 is used to support the faceplate panel 65 such that scratching and cracking of the edges of the faceplate panel cannot occur.

Both the adjustable rod 80 and the adaptor plate 46 are preferably made of stainless steel. FIG. 3a depicts a cross-sectional view of an adjustable rod 80 supporting a faceplate panel 65 in a retracted position. FIG. 3b depicts the adjustable rod 80 supporting a faceplate panel 65 in an extended position.

The adjustable rod 80 is moveable in a lateral direction such that the adaptor plate 46 may be used for supporting faceplate panels having varying dimensions. For example, faceplate panels having diagonal sizes of about 48 cm to about 97 cm may be supported on a 102 cm adaptor plate including adjustable rods having a lateral range of movement of up to about 25.4 cm. As such, many different size adaptor plates are not needed to accommodate all the different size faceplate panels that are to be manufactured, saving the time expended to position such plates on the metallization modules as well as the costs associated with their manufacture.

A support groove 87 is used to couple the adjustable rod 80 to shielding 60 within cavity 38. The support groove 87 functions to adjust the position of the shielding 60 relative to the adjustable rod 80, so that the shielding 60 does not touch the faceplate panel 65. The support groove 87 may be made of stainless steel sheet metal having a thickness of about 1.52 mm.

An evaporation means 61 (shown in FIG. 1) is supported above the base 44 of the metallization module 10. The evaporation means 61 typically comprises a filament for heating the metal (e. g., aluminum (Al)) to be evaporated onto the screen of the CRT faceplate. Examples of suitable evaporation means 61 include tungsten coils and/or ceramic susceptors, among others.

The metallization module 10 is coupled to a vacuum source (not shown) through port 35. Suitable vacuum sources may include for example, a vacuum pump.

A metal layer, such as, for example, aluminum (Al) may be applied to the screen of the CRT faceplate by placing the faceplate panel 65 within metallization module 10. Depending on the size of the faceplate panel 65, the one or more adjustable rods 80 are first laterally adjusted to accommodate the size of the faceplate panel 65. The faceplate panel 65 is then positioned on such one or more adjustable rods 80.

After the faceplate panel 65 is positioned within the metallization module 10, the lid 40 is closed and the module 10 is evacuated to a pressure, for example, of about $2.54 \times 10^{-5}$ cm Hg, and an aluminum layer having a thickness of about 1100 Å to about 2500 Å is deposited on the screen thereof

What is claimed is:

1. A metallization module for depositing a metal layer on an inner surface of a cathode-ray tube faceplate panel, comprising:

a vacuum chamber comprising a base attached to sidewalls, an adaptor plate attached to the sidewalls and a lid secured to the adaptor plate; and wherein the adaptor plate is positioned between the sidewalls and the lid, and wherein the adaptor plate includes a plurality of adjustable rods to support a cathode-ray tube faceplate panel within the vacuum chamber.

2. The metallization module of claim 1 wherein the adjustable rods are moveable in a lateral direction.

3. The metallization module of claim 1 wherein the metal layer deposited on the inner surface of the cathode-ray tube faceplate panel comprises aluminum (Al).

4. A metallization module for depositing a metal layer on an inner surface of a cathode-ray tube faceplate panel, comprising:

a vacuum chamber comprising a base attached to sidewalls having a top lip forming an open end, an adaptor plate secured along the top lip of the sidewalls, and a lid releasably securable to the adaptor plate over the open end;

wherein the adaptor plate comprises a plurality of adjustable rods mounted around the open end that function to support a cathode-ray tube faceplate panel within the vacuum chamber.

5. The metallization module of claim 4 wherein the adjustable rods extend from the adaptor plate into the vacuum chamber to support a variety of cathode-ray tube faceplate panel sizes.

6. The metallization module of claim 4 wherein the metal layer deposited on the inner surface of the cathode-ray tube faceplate panel comprises aluminum (Al).

7. A metallization module for depositing a metal layer on an inner surface of a cathode-ray tube faceplate panel, comprising:

a vacuum chamber wherein the vacuum chamber comprises a base attached to sidewalls, the sidewalls having a top lip forming an open end, an adaptor plate secured along the top lip of the sidewalls, and a lid hinged to the adaptor plate and adapted to provide an air-tight seal around the open end, said adaptor plate comprises a plurality of adjustable rods adjustably extending from the adaptor plate into the vacuum chamber to support a cathode-ray tube faceplate panel within the vacuum chamber a vacuum port extending from the vacuum chamber and coupled to a vacuum system to evacuate air from within the vacuum chamber; and an evaporation means adapted to deposit a metal layer on the inner surface of the cathode-ray tube faceplate panel upon evacuation of the air from within the vacuum chamber.

* * * * *